US005993545A

United States Patent [19]

Lupton et al.

[11] Patent Number: 5,993,545

[45] Date of Patent: Nov. 30, 1999

[54] CRUCIBLE FOR GROWING SINGLE CRYSTALS, PROCESS FOR MAKING THE SAME AND USE OF THE SAME

[75] Inventors: David Francis Lupton, Gelnhausen; Jörg Schielke, Bruchköbel; Manfred Weigelt, Linsengericht; Klaus Petermann, Wedel; Eric Mix, Hamburg; Livio Fornasiero, Norderstedt, all of Germany

[73] Assignee: W.C. Heraeus GmbH & Co. KG, Hanau, Germany

[21] Appl. No.: 09/005,327

[22] Filed: Jan. 9, 1998

[30] Foreign Application Priority Data

Jan. 24, 1997 [DE] Germany .......................... 197 02 465

[51] Int. Cl.[6] .................................................. C30B 15/10

[52] U.S. Cl. .......................................... 117/208; 117/220

[58] Field of Search .......................... 432/265; 420/433; 117/208, 220, 223

[56] References Cited

U.S. PATENT DOCUMENTS

| | | | |
|---|---|---|---|
| 3,610,204 | 10/1971 | Corrigan | 118/405 |
| 3,961,905 | 6/1976 | Rice | 117/204 |
| 4,066,449 | 1/1978 | Havel | 419/32 |
| 4,146,379 | 3/1979 | Copley et al. | 264/654 |
| 4,186,046 | 1/1980 | DeLai et al. | 117/37 |
| 4,444,728 | 4/1984 | Lanam et al. | 420/461 |
| 4,483,734 | 11/1984 | Sakaguchi et al. | 117/19 |
| 5,120,328 | 6/1992 | Pyzik | 51/309 |
| 5,416,795 | 5/1995 | Kaniuk et al. | 373/155 |

FOREIGN PATENT DOCUMENTS

| | | |
|---|---|---|
| 33 01 831 A1 | 9/1983 | Germany . |
| 2 142 935 | 1/1985 | United Kingdom . |

OTHER PUBLICATIONS

Lenel, Fritz V, "Powder Metallurgy" (Princeton NJ: Metal Powder Industries federation, 1980): 232–237, 404–405, 1980.

Ullmann's Encyclopedia of Industrial Chemistry, 4th Edition, vol. 15 (1978), 138–142.

Ullmann's Encyclopedia of Industrial Chemistry, 5th Edition, vol. A 23 (1993), 202–203.

Patent Abstracts of Japan, C–1103, 1993, vol. 17 of JP 05–117083.

Patent Abstracts of Japan, vol. 17, No. 577, (1993) of JP 05 170588A.

Patent Abstracts of Japan, vol. 14, No. 211 (1990) of JP 02 047258A.

*Primary Examiner*—Benjamin Utech
*Assistant Examiner*—Donald L. Champagne
*Attorney, Agent, or Firm*—Frishauf, Holtz, Goodman, Langer & Chick, P.C.

[57] ABSTRACT

A sintered rhenium crucible, highly suitable for growing single crystals from refractory metal oxides, for example by the Czochralski technique, is formed of fine rhenium powder, by sintering. A compact is formed by cold isostatic pressing and thereafter the compact is sintered at 500–2800° C. to obtain a sintered crucible. Product density is limited to 88–95% of theroretical in order to maximize creep resistance.

4 Claims, 2 Drawing Sheets

21
22
22
21

CRUCIBLE FOR GROWING SINGLE CRYSTALS, PROCESS FOR MAKING THE SAME AND USE OF THE SAME

BACKGROUND OF THE INVENTION

The invention relates to a crucible for growing single crystals from the melt in a substantially inert atmosphere, a process for making the same and use of the same.

The invention relates especially to a crucible for growing refractory single crystals, and most especially of single crystals from refractory metal oxides, preferably from alkaline earth and rare earth metal oxides and mixed oxides, in a substantially inert atmosphere.

Single crystals—which can be ultrapure or doped—are used for diverse purposes such as hard materials, drawing dies, jewel bearings, gemstones, optical components, materials for polarizing optics, laser crystals, electrooptical devices, semiconductors and memory crystals in data processing.

The preparation of single crystals takes place mainly by growth from a melt. Distinctions are made between pulling and descending techniques as well as techniques with and without a crucible. Suitable materials for crucibles include in particular graphite, noble metals (platinum, iridium, rhodium, gold) and noble metal alloys. The most important crucible crystal preparation techniques are the Bridgman-Stockbarger technique, the Nacken-Kyropoulos technique and the Czochralski technique.

In the Bridgman-Stockbarger technique, the single crystal is formed by spontaneous crystallization when the crucible containing the melt is shifted from a high-temperature furnace zone to a lower-temperature furnace zone. Crucibles suitable for this technique generally have cylindrical shape and a conically tapering bottom that narrows to a capillary. Graphite crucibles can be used to grow single crystals from oxygen-sensitive and moisture-sensitive substances under inert gas or vacuum, at the same time permitting temperatures above 2000° C. to be attained (Ullmanns Encyklopädie der technischen Chemie [Ullmanns Encyclopedia of Industrial Chemistry], 4th Edition, Volume 15 (1978), 138–140).

In the Nacken-Kyropoulos technique, the crucible is placed in a tube furnace and crystallization of the melt contained in the crucible is initiated by a cooled seed crystal. Characteristic of this technique is a long furnace zone of uniform temperature and a superheated melt into which the growing crystal extends progressively as a result of cooling (Ullmanns Encyclopedia of Industrial Chemistry, 4th Edition, Volume 15 (1978), 139 to 140).

The Czochralski technique is one of the most important techniques for growing single crystals. In this technique the substances provided for forming the single crystal are melted in a heated crucible and then the obtained melts are brought into contact with a seed crystal attached to a holder (seed-crystal holder). The single crystals growing on the seed crystal are pulled out of the melt at constant speed together with the seed crystal (pulling direction perpendicular to the melt surface) and, after their growth is ended, are separated from the melt and seed crystal.

The crucibles are commonly made of noble metals. For example, iridium crucibles are used to grow rubies by the Czochralski technique, an argon atmosphere containing 1 to 3% oxygen being used to protect the iridium. Crucibles of platinum, rhodium or noble metal alloys (Ullmanns Encyclopedia of Industrial Chemistry, 4th Edition, Volume 15 (1978), 140 to 142; U.S. Pat. No. 4,483,734) are suitable for growing lower melting oxides. During the growing process, the crucibles are mounted in a single-crystal-growing apparatus, which is equipped with a crucible heater and thermal insulation.

U.S. Pat. No. 4,186,046 discloses a process for growing single crystals from ceramic materials selected from the group consisting of dopants containing $Y_3Al_5O_{12}$, $Al_2O_3$, $MgAl_2O_4$ and eutectics of $Al_2O_3/ZrO_2$ and $Al_2O_3/Y_3Al_5O_{12}$ which process is a combination of the technique of zone leveling with the gradient furnace technique. The process includes the step of seeding the melt of a ceramic material in a crucible. The crucible is preferably of high melting point material such as molybdenum, tungsten, iridium, or rhenium or of coated materials thereof.

From DE 3,301,831 Al (U.S. Pat. No. 4,444,728) there is known, for growing single crystals, a crucible consisting of an iridium-rhenium alloy with a rhenium content of about 1 to 20, especially about 1 to 15 parts by weight of rhenium. The crucible has a melting point of about 2450 to 2540° C. and is made by hot forming and subsequent processing of iridium/rhenium obtained by sintering or casting mixtures of iridium and rhenium powders. It is preferably used to grow single crystals of gadolinium-gallium garnet by the Czochralski technique under a substantially inert atmosphere. The substantially inert atmosphere consists of an inert or slightly oxidizing atmosphere such as nitrogen, argon, helium or $CO/CO_2$ or $N_2/O_2$ mixtures; preferred is an atmosphere of about 98 vol % nitrogen and 2 vol % oxygen. DE 3,301,831 Al describes the well-known fact that the oxidation resistance of rhenium is lower than that of iridium and that rhenium is rapidly disintegrated by intense oxidation at high temperatures. Crucibles of iridium and iridium-base materials can be used to grow single crystals from melts having temperatures up to about 2200° C. As regards growing crystals requiring even higher temperatures, however, crucible materials with adequate chemical and thermal stability are usually unavailable, and so in many cases these crystal types can be prepared only by crucible-free techniques or by cold-crucible techniques.

The object of the invention is therefore to find a crucible of high melting point material with high strength for growing refractory single crystals from the melt in a substantially inert atmosphere and a process for making the same. The crucible is intended to be suitable in particular for growing single crystals of refractory metal oxides and to be usable in the Bridgman-Stockbarger, Nacken-Kyropoulos and Czochralski techniques.

BRIEF SUMMARY OF THE INVENTION

The object is achieved according to the invention by making the crucible of sintered substantially pure rhenium. Sintering a cold pressed crucible compact of substantially pure rhenium powder at 500 to 2800° C. in a vacuum has been found particularly advantageous. Preferably the rhenium powder has a purity of at least 99.8% and the sintered rhenium has a density of 88% to 95% of theoretical density.

DETAILED DESCRIPTION OF THE INVENTION

The rhenium crucible obtained by powder metallurgy has proved particularly successful. Preferred is a crucible of sintered rhenium having a density of approximately 88 to 95% of theoretical density.

Figure 2A:
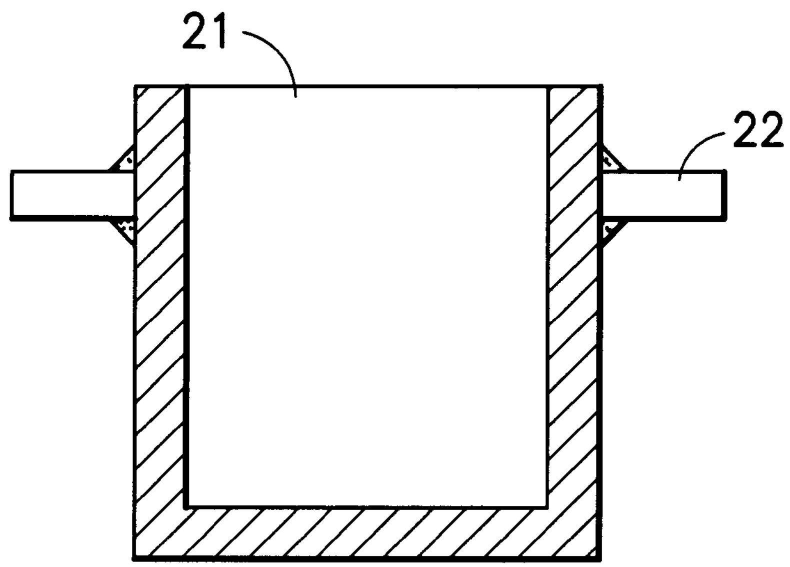
FIGS. 2A and 2B show a crucible with welded-on wires as elements by which the crucible can be supported.
Figure 2B:
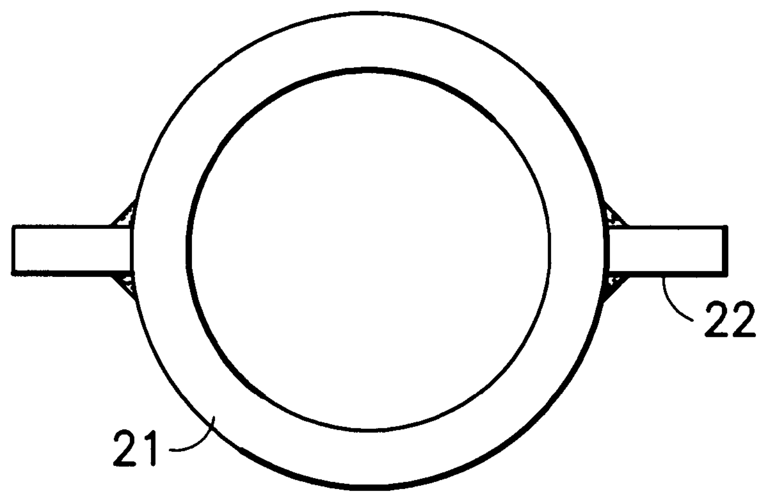

Referring to FIGS. 2A and 2B, in one particular embodiment, the crucible can be equipped with support elements 22 of rhenium, preferably of rhenium wire, welded to the crucible wall 21, by which the crucible can be supported. This form of the crucible is preferred when—at high temperatures—direct contact and thereby reaction between the crucible and thermal insulation, must be avoided. In this case the crucible equipped with the support elements 22, can be supported by a suspension element in such a way that the crucible does not touch the thermal insulation.

The term "substantially inert atmosphere" as used in the invention encompasses an inert or slightly reducing atmosphere comprising, for example, helium, argon, nitrogen or an argon-hydrogen mixture with a hydrogen content of 5 vol %.

The second object of the invention is achieved by a process for making the crucible which is characterized according to the invention in that a crucible compact is formed from fine rhenium powder by isostatic cold-pressing at a pressure of 300 to 700 MPa and then sintered at 500 to 2800° C. in vacuum. The term "fine rhenium powder" as used in the invention encompasses preferably a rhenium powder with a mean particle size of 1 to 20 microns. The process has proved particularly successful when rhenium powder with a purity of at least 99.8% and a mean particle size of 3 to 12 microns is used. Rhenium powder produced by the reduction of pure ammonium perrhenate $NH_4ReO_4$ in a stream of hydrogen has proved particularly successful (1).

(1) Ullmann's Encyclopedia of Industrial Chemistry, 5th Edition, Volume A 23 (1993), 202 to 203.

A preferred embodiment of the invention relates to a crucible of sintered rhenium with a density of 90% of theoretical and to the process for making the crucible from rhenium powder with a purity of 99.99% and a mean particle size of about 6.6 microns, by isostatic cold pressing with a pressure of about 700 MPa followed by sintering at temperatures progressing from 500 to 2500° C., as described in Example 1. The sintering conditions, which must be chosen such that a crucible with the required density is obtained, are determined by preliminary tests.

The crucible according to the invention has proved particularly successful when it is used to grow single crystals from oxides having a melting point of higher than 2000° C., preferably having a melting point in the range of 2400 to 2500° C.; the melts contained in the rhenium crucible can have temperatures up to about 2800° C.

Surprisingly, despite the known sensitivity of rhenium to oxygen, the tolerance of the sintered rhenium oxidic melts is very good; reduction of oxidic melts and contamination of the melts and single crystals by the crucible material are not observed.

Furthermore, it has surprisingly been found that a crucible of the present invention has better creep resistance when the form of rhenium preferred for the crucible according to the invention is used—sintered rhenium with a density of about 88 to 95% of theoretical density—by comparison with rhenium in dense recrystallized form and with iridium obtained by melting metallurgy, as was established by creep tests at temperatures of up to 3000° C. (Example 3). For an exposure duration of 10 hours, the sintered rhenium with a density of 90% still has a strength of about 5.0 MPa at 2800° C., while the dense recrystallized rhenium has a strength of only 4.2 MPa. For comparison, iridium has a strength of 5.0 MPa at 2200° C.

The crucible according to the invention is preferably of the type used for growing single crystals from oxides and mixed oxides of alkaline earth metals (beryllium to barium) and rare earth metals (scandium, yttrium and lanthanum to lutetium). Single crystals of scandium oxide ($Sc_2O_3$), yttrium oxide ($Y_2O_3$), scandium-yttrium oxide ($ScYO_3$), holmium oxide ($Ho_2O_3$), lutetium oxide ($Lu_2O_3$) and lutetium-yttrium oxide ($LuYO_3$) can be grown with particular success by the Bridgman-Stockbarger, the Nacken-Kyropoulos technique and the Czochralski technique.

The alkaline earth and rare earth metal oxide and mixed oxide single crystals grown by means of the crucible according to the invention are free of defects and stresses and have excellent size, purity and optical quality, meaning that they can be used very successfully for optical components, as substrates for semiconductor layers and—if appropriately doped—as laser crystals.

The invention will be illustrated in more detail in the following examples, which describe a crucible of sintered rhenium and the making of the same (Examples 1 and 2) as well as the determination of the creep resistance of specimens of a) sintered rhenium with a density of about 90% of theoretical density, b) dense recrystallized rhenium and c) iridium obtained by melting metallurgy (Example 3).

EXAMPLE 1

Crucible Preparation

Rhenium powder with a purity of 99.99% and a mean particle size of 6.6 microns, obtained by reducing ammonium perrhenate with hydrogen, is packed into a rubber mold equipped with a fine-ground steel core. The size and shape of the rubber mold and of the steel core forming the subsequent crucible inside space are chosen to match the desired size and cylindrical shape of the crucible. The rubber mold packed with the steel core and rhenium powder is tightly sealed with a rubber stopper and placed in an oil bath. By isostatic cold-pressing with a hydrostatic pressure of 700 MPa, the rhenium powder contained in the rubber mold is compacted to a crucible compact. After removal of the rubber stopper and steel core, the crucible compact is released from the rubber mold and sintered under vacuum ($10^{-4}$ to $10^{-5}$ mbar), at first for 1 hour each at 500° C., 750° C., 1000° C. and 1200° C., then for 2 hours at 1500° C. and finally for 3 hours at 2500° C. The sintered crucible blank obtained in this way is finish-machined (by wire electrical discharge and grinding) to yield the finished crucible of sintered rhenium. The cylindrical crucible comprises sintered rhenium with a density of 90% of theoretical density and has an inside diameter of 18 mm, a wall thickness of 2.5 mm and an inside height of 20.5 mm.

EXAMPLE 2

Crucible Preparation

Rhenium powder with a purity of 99.8% and a mean particle size of 10 microns, obtained by reducing ammonium perrhenate with hydrogen, is packed into a rubber mold equipped with a fine-ground steel core. The size and shape of the rubber mold and of the steel core forming the subsequent crucible inside space are chosen to match the desired size and cylindrical shape of the crucible. The rubber mold packed with the steel core and rhenium powder is tightly sealed with a rubber stopper and placed in an oil bath. By isostatic cold-pressing with a hydrostatic pressure of 300 MPa, the rhenium powder contained in the rubber mold is compacted to a crucible compact. After removal of the rubber stopper and steel core, the crucible compact is released from the rubber mold and sintered under vacuum ($10^{-4}$to $10^{-5}$ mbar), at first for 1 hour each at 500° C., 750°

C., 1000° C. and 1200° C., then for 2 hours at 1500° C. and finally for 3 hours at 2500° C. The sintered crucible blank obtained in this way is finish-machined (by wire electrical discharge and grinding) to yield the finished crucible of sintered rhenium. The cylindrical crucible comprises sintered rhenium with a density of 90.3% of theoretical density and has an inside diameter of 18 mm, a wall thickness of 2.5 mm and an inside height of 20.5 mm.

EXAMPLE 3

Determination of Creep Resistance

The creep tests to determine creep resistance are performed in the apparatus described in DD 245,576 A3. By means of this apparatus, a) specimens comprising sintered rhenium with a density of 90% and having a cross section of 1×1 $mm^2$ and a length of 120 mm, in an atmosphere of argon and 5 vol % hydrogen, b) specimens comprising recrystallized rhenium with a density of greater than 99% of theoretical density and having a diameter of 2 mm and a length of 120 mm, in an atmosphere of argon and 5 vol % hydrogen and c) specimens comprising iridium and having a cross section of 1×1 $mm^2$ and a length of 120 mm, in an argon atmosphere are heated to specified temperatures in the range from 2000 to 3000° C. and then subjected to specified tensile loads until rupture of the specimens. Creep rupture diagrams are then constructed by plotting the time elapsed until rupture versus the tensile load. The tensile load causing rupture after 10 hours is determined by interpolation of the respective diagram and reported as the 10-hour creep rupture stress $R_{m/10h}$ [MPa] in the following table.

Figure 1:
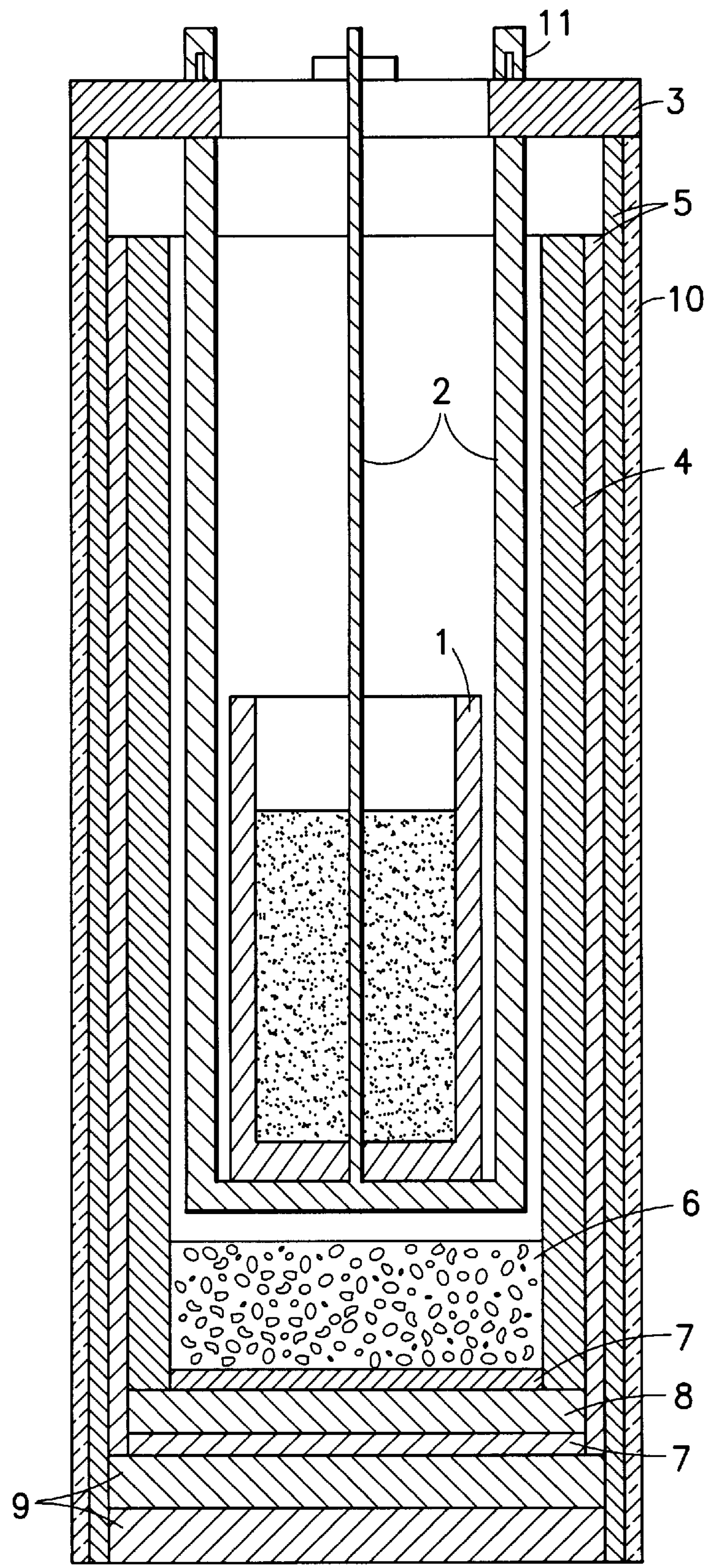
FIG. 1 shows a crucible mounted in a furnace.

| | 10-hour creep rupture stress $R_{m/10\,h}$ [MPa] | | |
|---|---|---|---|
| Temperature [°C.] | a) Re, 90% dense | b) Re, > 99% dense | c) Ir, melting metallurgy |
| 2000 | — | — | 9.00 |
| 2100 | 12.50 | 24.00 | — |
| 2200 | — | — | 5.00 |
| 2300 | — | — | 2.30 |
| 2500 | 6.00 | 18.00 | nm |
| 2700 | — | 9.10 | nm |
| 2800 | 5.00 | 4.20 | nm |
| 3000 | 3.40 | nm | nm |

nm: measurement not possible because material strength too low (or temperature > melting point)
—: measurement not performed Practical Example of Growing Crystals The practical example in FIG. 1 shows the type of insulation configuration used for growing refractory oxides up to maximum temperatures of 2800° C by the Czochralski technique.

The crucible (1) filled with powdered oxide is placed in a cage of rhenium sections (2) and is suspended from above in a quartz-glass tube glass tube (10) lined with insulating materials. The cage is secured with rhenium split pins (11) to an aluminum oxide ring (3), which rests on the quartz-glass tube. For thermal insulation the cage containing the crucible is enclosed by a zirconium oxide tube (4), which is wrapped by two zirconium oxide mats (5). The thermal insulation under the crucible comprises zirconium oxide granules (6), a zirconium oxide mat (7), a zirconium oxide disk (8), a further mat of zirconium oxide (7) and two aluminum oxide disks (9).

The entire structure is mounted centrally in the induction coil in the shell of the growing system in such a way that the induction coil heats the crucible optimally.

To grow crystals, the shell is first evacuated and then a stream of inert or reducing gas (nitrogen or noble gas or hydrogen) is passed therethrough.

After the oxide packed into the crucible has been melted, a rotating pulling rod of rhenium or a seed holder containing a seed crystal is brought from above into contact with the melt. After seeding, the pulling rod or seed holder containing the resulting crystal is raised from the melt at rates typically equal to 0.5 to 3 mm/h. In the process, the diameter of the growing crystal is controlled automatically or manually by means of the input HF power. The rotation of typically 5 to 20 rpm favors uniform crystal growth.

The above is intended to be illustrative, not limitative of the invention.

What is claimed is:

1. In a crucible for growing single crystals from the melt in a substantially inert atmosphere, the improvement wherein the crucible consists of sintered rhenium having a find as fabricated, density of 88 to 95% of theoretical density.

2. A crucible according to claim 1, wherein the sintered rhenium has a purity of at least 99.8%.

3. A crucible according to claim 1, further comprising a rhenium welded-on support element.

4. A crucible according to claim 3, wherein the welded-on support element consists essentially of rhenium wire.

* * * * *